(12) United States Patent
Shimada et al.

(10) Patent No.: US 8,852,451 B2
(45) Date of Patent: Oct. 7, 2014

(54) SILICON ETCHING FLUID AND METHOD FOR PRODUCING TRANSISTOR USING SAME

(75) Inventors: Kenji Shimada, Tokyo (JP); Hiroshi Matsunaga, Tokyo (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 0 days.

(21) Appl. No.: 13/823,769

(22) PCT Filed: Jul. 26, 2011

(86) PCT No.: PCT/JP2011/066998
§ 371 (c)(1),
(2), (4) Date: Mar. 15, 2013

(87) PCT Pub. No.: WO2012/035888
PCT Pub. Date: Mar. 22, 2012

(65) Prior Publication Data
US 2013/0178069 A1     Jul. 11, 2013

(30) Foreign Application Priority Data

Sep. 17, 2010   (JP) ................. 2010-209475

(51) Int. Cl.
| | |
|---|---|
| *C09K 13/00* | (2006.01) |
| *H01L 21/3213* | (2006.01) |
| *H01L 29/66* | (2006.01) |
| *H01L 21/306* | (2006.01) |
| *H01L 21/8238* | (2006.01) |
| *H01L 21/02* | (2006.01) |

(52) U.S. Cl.
CPC .......... *C09K 13/00* (2013.01); *H01L 21/32134* (2013.01); *H01L 21/02068* (2013.01); *H01L 29/66545* (2013.01); *H01L 21/30604* (2013.01); *H01L 21/823842* (2013.01)

USPC .......................................... 252/79.1; 438/753

(58) Field of Classification Search
USPC ............................ 252/79.1; 216/83; 438/753
See application file for complete search history.

(56) References Cited

U.S. PATENT DOCUMENTS 7,316,949 B2    1/2008  Doczy et al.

FOREIGN PATENT DOCUMENTS

| JP | 2002 359369 | 12/2002 |
| JP | 2005 229053 | 8/2005 |

(Continued)

OTHER PUBLICATIONS

U.S. Appl. No. 13/819,107, filed Apr. 19, 2013, Shimada, et al.

(Continued)

*Primary Examiner* — Roberts Culbert
(74) *Attorney, Agent, or Firm* — Oblon, Spivak, McClelland, Maier & Neustadt, L.L.P.

(57) ABSTRACT

The present invention relates to a silicon etching solution which is used for selectively etching a dummy gate made of silicon in a process for producing a transistor including a laminate formed of at least a high dielectric material film and a metal gate containing hafnium, zirconium, titanium, tantalum or tungsten by the method of removing the dummy gate made of silicon to replace the dummy gate with the metal gate and which includes 0.1 to 40% by weight of at least one alkali compound selected from the group consisting of ammonia, a diamine and a polyamine represented by the general formula (1), 0.01 to 40% by weight of at least one polyhydric alcohol selected from the group consisting of specific polyhydric alcohols and a non-reducing sugar, and 40 to 99.89% by weight of water, and a process for producing a transistor using the silicon etching solution.

10 Claims, 1 Drawing Sheet

(56) References Cited

FOREIGN PATENT DOCUMENTS

| JP | 2006 351813 | 12/2006 |
| JP | 2007 214456 | 8/2007 |
| JP | 3994992 | 10/2007 |
| JP | 2009 152342 | 7/2009 |

OTHER PUBLICATIONS

"Applied Physics," vol. 76, No. 9, p. 1006 to 1012, (2007).
"Micro-Machine/MEMS Technologies," MEMS Technology Outlook, p. 111, (2003).

International Search Report Issued Aug. 23, 2011 in PCT/JP11/66998 Filed Jul. 26, 2011.

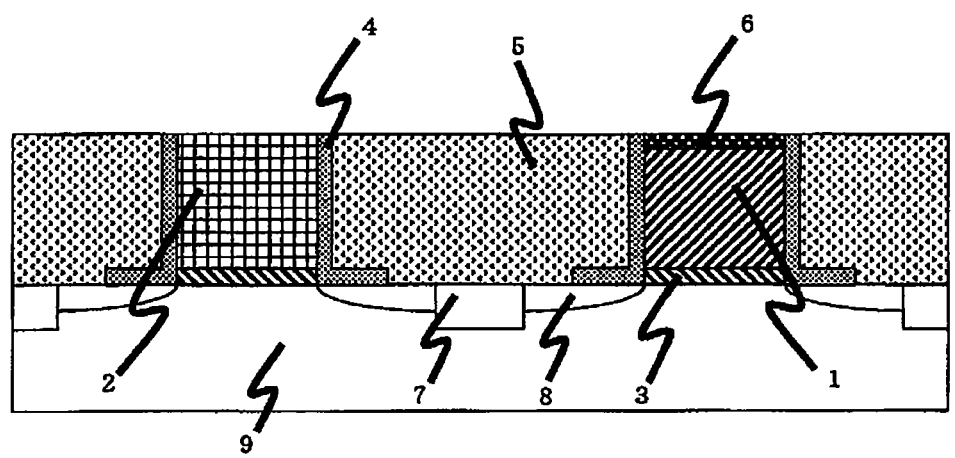

SILICON ETCHING FLUID AND METHOD FOR PRODUCING TRANSISTOR USING SAME

TECHNICAL FIELD

The present invention relates to an etching solution used for selectively etching a dummy gate made of silicon in a process for producing a transistor using a structural body including a dummy gate laminate formed by laminating at least a high dielectric material film and the dummy gate made of silicon in which the dummy gate is replaced with a metal gate containing hafnium, zirconium, titanium, tantalum or tungsten, and a process for producing a transistor using the etching solution.

BACKGROUND ART

Hitherto, semiconductors have been continuously improved in performance, costs and power consumption by reduction of a gate length and a gate thickness of transistors, i.e., so-called micronization thereof. However, if it is intended to achieve the micronization of transistors as recently required, the gate thickness of transistors using a conventional gate insulating film made of silicon oxide becomes excessively small, so that a leakage current owing to a tunnel current increases, and power consumption becomes large. In addition, in recent years, there is an increasing demand for mobile equipments using semiconductor devices such as mobile phones, notebook type personal computers and potable music players. In this case, a power supply for these mobile equipments has been frequently relied upon rechargeable batteries. Therefore, it has been required that the semiconductor devices used in the mobile equipments have a low power consumption to achieve long-term use thereof. In consequence, for the purpose of reducing a leakage current during a stand-by state of the equipments, there has been proposed the technique in which as combination of an insulating material and a gate electrode as constituents of a transistor, combination of a high dielectric material and a metal gate is used in place of the conventional combination of silicone oxide and polysilicon (Non-Patent Document 1).

There have been conventionally proposed various methods for producing the high dielectric material and the metal gate. As one of the conventional methods, there has been proposed a so-called gate-last method in which after producing a transistor using combination of a high dielectric material and polysilicon, the polysilicon is removed to replace it with a metal gate (Non-Patent Document 1). In FIG. 1, there is shown a schematic sectional view of a part of a transistor before removing polysilicon from a semiconductor device using a high dielectric material. In recent years, when subjecting the polysilicon to wet-etching, a sheet cleaning apparatus for cleaning a silicon wafer one by one to suppress generation of particles has been frequently used. For this reason, if an etching amount of the polysilicon per unit time (hereinafter referred to as an "etch rate") is small, the time required for the etching tends to be prolonged, so that the production output per device tends to be lowered. Thus, it has been required to develop a technique for etching polysilicon for a short period of time without occurrence of corrosion of a high dielectric material, a metal, a side wall and an interlayer insulating film in the step of removing the polysilicon.

As the technique for etching polysilicon, there is also known the method of subjecting the polysilicon to dry etching (Patent Document 1). However, not only the polysilicon but also the side wall and the interlayer insulating film are etched in the dry etching process. Therefore, it is necessary to provide a protective film such as a photoresist on the side wall and the interlayer insulating film. If such a protective film is formed, the production process tends to become complicated, so that there tend to arise the problems such as poor yield and increase in production costs. In addition, an ashing treatment required to remove the photoresist tends to cause deterioration in quality of the interlayer insulating film, which tends to cause a risk of deteriorating a performance of transistors. Also, in general, for the purpose of preventing generation of fine silicon residues, the silicon is subjected to so-called overetching in which the etching is carried out for a longer period of time than an etching treatment time calculated from the etch rate. In the dry-etching process, the high dielectric material exposed after etching the silicon tends to be etched or tends to be deteriorated in quality when subjected to the overetching, resulting in deterioration in performance of transistors.

As a cleaning solution used upon etching silicon by a wet etching method, there are known various alkaline cleaning solutions (Non-Patent Document 2). However, since these cleaning solutions have a low silicon etch rate, the time required for the etching tends to be prolonged, so that the production output per device tends to be lowered.

As a technique of etching silicon at a high etch rate, there has been proposed the use of an etching composition containing an inorganic alkali compound and a hydroxyl amine (Patent Document 2). However, alkali metal ions contained in the inorganic alkali compound tend to cause considerable deterioration in performance of transistors. Therefore, the etching composition are not applicable to production of transistors.

As another technique of etching silicon at a high etch rate, there has also been proposed the use of an etching composition containing an organic alkali compound and at least one reducing compound selected from the group consisting of hydroxyl amines, hypophosphites, reducing sugars, ascorbic acid, glyoxylic acid, brenzcatechin and derivatives of these compounds (refer to Patent Document 3 and Comparative Example 3).

There has also been proposed the stripping solution capable of suppressing etching of aluminum and reducing an adhesion strength of an adhesive film which is in the form of an alkaline solution containing a sugar alcohol as an anticorrosive agent (Patent Document 4). However, in the technique proposed in Patent Document 4, etching of aluminum with the alkaline stripping solution is prevented from such a viewpoint that its capability of reducing an adhesion strength of the adhesive film is not inhibited. Thus, Patent Document 4 fails to describe a polysilicon etching capability of the alkaline stripping solution. Therefore, the technique described in Patent Document 4 is different from that of the present invention which aims at attaining a high polysilicon etch rate. Further, in Patent Document 4, it is described that the stripping solution used therein is not particularly limited as long as it is in the form of an alkaline solution. However, alkaline compounds capable of etching the polysilicon are limited to specific compounds. Thus, the compounds suitably used in the present invention are not easily suggested from the descriptions of the Patent Document 4 (refer to Comparative Examples 4).

As a material for the metal gate, there have been adopted not only the above aluminum but also metals such as zirconium, titanium, tantalum and tungsten. However, at present, there are present no etching solutions which are suitable for production of transistors using a metal gate containing these materials. In consequence, in the process for producing a transistor including a laminate formed of at least a high dielectric material film and a metal gate containing hafnium, zirconium, titanium, tantalum or tungsten by a method of removing a dummy gate made of silicon to replace the dummy gate with the metal gate, it has been intensively demanded to provide an etching solution which is capable of selectively removing the dummy gate by etching, as well as a process for producing the transistor.

PRIOR ART DOCUMENTS

Patent Documents

Patent Document 1: U.S. Pat. No. 7,316,949
Patent Document 2: JP 2006-361813A
Patent Document 3: JP 3994992
Patent Document 4: JP 2005-229053A Non-Patent Documents Non-Patent Document 1: "Applied Physics", 76, 9, 2007, p. 1006
Non-Patent Document 2: "Complete Collection of Micro-Machine/MEMS Technologies", 2003, p. 111

BRIEF DESCRIPTION OF THE DRAWING

FIG. 1 is a sectional view of a transistor using a high dielectric material before removing silicon therefrom.

EXPLANATION OF REFERENCE NUMERALS

1: Dummy gate (silicon); 2: Metal gate; 3: High dielectric material film; 4: Side wall; 5: Interlayer insulating film; 6: Natural silicon oxide film; 7: Isolation; 8: Source/drain; 9: Substrate

DISCLOSURE OF THE INVENTION

Problem to be Solved by the Invention

An object of the present invention is to provide an etching solution used for selectively etching a dummy gate made of silicon in a process for producing a transistor including a laminate formed of at least a high dielectric material film and a metal gate containing hafnium, zirconium, titanium, tantalum or tungsten by the method of removing the dummy gate made of silicon to replace the dummy gate with the metal gate, and a process for producing a transistor using the etching solution.

Means for Solving the Problem

As a result of an earnest study for achieving the above object, the present inventors have found that the above object of the present invention can be achieved by using a specific silicon etching solution for etching a dummy gate made of silicon. The present invention has been accomplished on the basis of the above finding. That is, the present invention provides the following aspects.

1. A silicon etching solution for etching a dummy gate made of silicon in a process for producing a transistor using a structural body including a substrate, and a dummy gate laminate formed by laminating at least a high dielectric material film and the dummy gate made of silicon, a side wall disposed to cover a side surface of the laminate and an interlayer insulating film disposed to cover the side wall which are provided on the substrate, in which the dummy gate is replaced with a metal gate containing hafnium, zirconium, titanium, tantalum or tungsten, said silicon etching solution including 0.1 to 40% by weight of at least one alkali compound selected from the group consisting of ammonia, a diamine and a polyamine represented by the general formula (1), 0.01 to 40% by weight of at least one polyhydric alcohol selected from the group consisting of a polyhydric alcohol represented by the general formula (2), a polyhydric alcohol represented by the general formula (3), a cyclic polyhydric alcohol represented by the general formula (4) and a non-reducing sugar, and 40 to 99.89% by weight of water:

$$H_2N-(CH_2CH_2NH)_k-H \quad (1)$$

wherein k is an integer of 2 to 5;

$$H-(CH(OH))_l-R \quad (2)$$

wherein l is an integer of 2 to 6; and R is hydrogen or an alkyl group;

$$C-((CH_2)_mOH)_4 \quad (3)$$

wherein m is an integer of 1 or 2; and $$(CH(OH))_n \quad (4)$$

wherein n is an integer of 3 to 8.

2. The silicon etching solution as described in the above aspect 1, wherein the diamine and the polyamine represented by the general formula (1) are at least one compound selected from the group consisting of ethylenediamine, 1,2-propanediamine and 1,3-propanediamine, and at least one compound selected from the group consisting of diethylenetriamine and triethylenetetramine, respectively.

3. The silicon etching solution as described in the above aspect 1, wherein the polyhydric alcohol represented by any of the general formulae (2) to (4) is at least one compound selected from the group consisting of ethylene glycol, glycerin, meso-erythritol, xylitol, sorbitol, propylene glycol, pentaerythritol and inositol.

4. The silicon etching solution as described in the above aspect 1, wherein the non-reducing sugar is sucrose, trehalose or raffinose.

5. The silicon etching solution as described in the above aspect 1, wherein a high dielectric material forming the high dielectric material film is $HfO_2$, HfSiO, HfSiON, HfLaO, HfLaON, HfTiSiON, HfAlSiON, HfZrO or $Al_2O_3$.

6. A process for producing a transistor using a structural body including a substrate, and a dummy gate laminate formed by laminating at least a high dielectric material film and a dummy gate made of silicon, a side wall disposed to cover a side surface of the laminate and an interlayer insulating film disposed to cover the side wall which are provided on the substrate, said process including the following step (I) in which the dummy gate is replaced with a metal gate containing hafnium, zirconium, titanium, tantalum or tungsten:

Step (I): etching the silicon with a silicon etching solution including 0.1 to 40% by weight of at least one alkali compound selected from the group consisting of ammonia, a diamine and a polyamine represented by the general formula (1), 0.01 to 40% by weight of at least one polyhydric alcohol selected from the group consisting of a polyhydric alcohol represented by the general formula (2), a polyhydric alcohol represented by the general formula (3), a cyclic polyhydric alcohol represented by the general formula (4) and a non-reducing sugar, and 40 to 99.89% by weight of water:

$$H_2N\text{—}(CH_2CH_2NH)_k\text{—}H \quad (1)$$

wherein k is an integer of 2 to 5;

$$H\text{—}(CH(OH))_l\text{—}R \quad (2)$$

wherein l is an integer of 2 to 6; and R is hydrogen or an alkyl group;

$$C\text{—}((CH_2)_mOH)_4 \quad (3)$$

wherein m is an integer of 1 or 2; and $$(CH(OH))_n \quad (4)$$

wherein n is an integer of 3 to 8.

7. The process for producing a transistor as described in the above aspect 6, wherein the diamine and the polyamine represented by the general formula (1) are at least one compound selected from the group consisting of ethylenediamine, 1,2-propanediamine and 1,3-propanediamine, and at least one compound selected from the group consisting of diethylenetriamine and triethylenetetramine, respectively.

8. The process for producing a transistor as described in the above aspect 6, wherein the polyhydric alcohol represented by any of the general formulae (2) to (4) is at least one compound selected from the group consisting of ethylene glycol, glycerin, meso-erythritol, xylitol, sorbitol, propylene glycol, pentaerythritol and inositol.

9. The process for producing a transistor as described in the above aspect 6, wherein the non-reducing sugar is sucrose, trehalose or raffinose.

10. The process for producing a transistor as described in the above aspect 6, wherein a high dielectric material forming the high dielectric material film is $HfO_2$, HfSiO, HfSiON, HfLaO, HfLaON, HfTiSiON, HfAlSiON, HfZrO or $Al_2O_3$.

Effect of the Invention

According to the present invention, in a process for producing a transistor including a laminate formed of at least a high dielectric material film and a metal gate containing hafnium, zirconium, titanium, tantalum or tungsten by the method in which a dummy gate made of silicon is removed and replaced with the metal gate, it is possible to selectively remove the silicon by etching. As a result, according to the present invention, it is possible to produce a transistor having a high precision and a high quality with a high yield.

PREFERRED EMBODIMENTS FOR CARRYING OUT THE INVENTION

Silicon Etching Solution

The silicon etching solution according to the present invention is used for etching a dummy gate made of silicon in a process for producing a transistor using a structural body which includes a substrate, and a dummy gate laminate formed by laminating at least a high dielectric material film and the dummy gate made of silicon, a side wall disposed to cover a side surface of the laminate and an interlayer insulating film disposed to cover the side wall which are provided on the substrate, in which the dummy gate is replaced with a metal gate containing hafnium, zirconium, titanium, tantalum or tungsten. The silicon etching solution includes 0.1 to 40% by weight of at least one alkali compound selected from the group consisting of ammonia, a diamine and a polyamine represented by the general formula (1), 0.01 to 40% by weight of at least one polyhydric alcohol selected from the group consisting of a polyhydric alcohol represented by the general formula (2), a polyhydric alcohol represented by the general formula (3), a cyclic polyhydric alcohol represented by the general formula (4) and a non-reducing sugar, and 40 to 99.89% by weight of water:

$$H_2N\text{—}(CH_2CH_2NH)_k\text{—}H \quad (1)$$

wherein k is an integer of 2 to 5;

$$H\text{—}(CH(OH))_l\text{—}R \quad (2)$$

wherein l is an integer of 2 to 6; and R is hydrogen or an alkyl group;

$$C\text{—}((CH_2)_mOH)_4 \quad (3)$$

wherein m is an integer of 1 or 2; and $$(CH(OH))_n \quad (4)$$

wherein n is an integer of 3 to 8.

The alkali compound used in the present invention serves for etching silicon, and is at least one compound selected from the group consisting of ammonia, a diamine and a polyamine represented by the general formula (1). Examples of the preferred diamine contained in the silicon etching solution according to the present invention include ethylenediamine, 1,2-propanediamine and 1,3-propanediamine. Examples of the preferred polyamine represented by the general formula (1) include diethylenetriamine and triethylenetetramine.

The concentration of the alkali compound in the etching solution is usually from 0.1 to 40% by weight, preferably from 0.2 to 40% by weight and more preferably from 0.3 to 30% by weight. When the concentration of the alkali compound in the etching solution is less than 0.1% by weight or more than 40% by weight, it tends to be difficult to attain an effective etch rate.

The polyhydric alcohol used in the present invention is at least one compound selected from the group consisting of a polyhydric alcohol represented by the general formula (2), a polyhydric alcohol represented by the general formula (3), a cyclic polyhydric alcohol represented by the general formula (4) and a non-reducing sugar.

Specific examples of the preferred polyhydric alcohol represented by the general formula (2) include ethylene glycol, glycerin, meso-erythritol, xylitol, sorbitol and propylene glycol. Specific examples of the preferred polyhydric alcohol represented by the general formula (3) include pentaerythritol. Specific examples of the preferred cyclic polyhydric alcohol represented by the general formula (4) include inositol. Specific examples of the preferred non-reducing sugar include sucrose, trehalose and raffinose. These polyhydric alcohols may be respectively used alone or in combination of any two or more thereof.

The concentration of the polyhydric alcohol in the etching solution is usually from 0.001 to 50% by weight, preferably from 0.005 to 40% by weight and more preferably from 0.01 to 40% by weight. When the concentration of the polyhydric alcohol in the etching solution is less than 0.001% by weight, the resulting etching solution tends to fail to exhibit a sufficiently high silicon etch rate. On the other hand, when the concentration of the polyhydric alcohol in the etching solution is more than 50% by weight, the resulting etching solution tends to have a low silicon etch rate.

The silicon etching solution according to the present invention may further contain various additives ordinarily used in conventional etching solutions such as a surfactant and an anticorrosive agent, if required, unless the addition of these additives causes any adverse influence on the objects and effects of the present invention.

<<Structural Body>>

The silicon etching solution according to present invention is used for etching a dummy gate made of silicon in a structural body which includes, on a substrate, a dummy gate laminate formed of a high dielectric material film and the dummy gate made of silicon, a side wall disposed to cover a side surface of the laminate and an interlayer insulating film disposed to cover the side wall. In FIG. 1, there is shown a sectional view of the structural body with the dummy gate to be etched with the etching solution according to the present invention. The structural body shown in FIG. 1 is provided on a substrate 9 with a dummy gate laminate formed by laminating a high dielectric material film 3 and a dummy gate 1 made of silicon, a side wall 4 disposed to cover a side surface of the laminate and an interlayer insulating film 5 disposed to cover the side wall 4. The silicon material such as polysilicon which is used as a material for the dummy gate 1 is also brought into contact with air during the process for production of transistors, so that the surface of the dummy gate is subjected to natural oxidation to thereby produce a natural silicon oxide film 6 thereon. Therefore, the natural silicon oxide film 6 is also shown in FIG. 1.

As shown in FIG. 1, the structural body may have a portion in which the dummy gate 1 has been already replaced with a metal gate 2 containing hafnium, zirconium, titanium, tantalum or tungsten. In addition, in FIG. 1, there are shown a source/drain region 8 and an isolation 7 which may be formed by a suitable method such as ion implantation. The high dielectric material film 3 is usually provided on the surface of the substrate 9 so as to cover a portion between the source/drain regions 8.

As shown in FIG. 1, the structural body may have a portion in which the dummy gate 1 has been already replaced with the metal gate 2. The metal gate 2 as used herein means a metal gate containing hafnium, zirconium, titanium, tantalum or tungsten, but is not necessarily formed of 100% of hafnium, zirconium, titanium, tantalum or tungsten. From the viewpoint of sufficiently attaining the effects of the present invention, the content of the above metal in the metal gate is preferably 50% or more. Further, either a whole or a part of the dummy gate may be replaced with the metal gate formed of the above metal. In the present invention, even when the above metal is used only as a part of the transistor, it is possible to attain such an effect of the present invention that silicon forming the dummy gate is selectively etched without etching a portion made of the metal.

In addition, in FIG. 1, there are shown a source/drain region 8 and an isolation 7 which may be formed by a suitable method such as ion implantation. The high dielectric material film 2 is usually provided on the surface of the substrate 9 so as to cover a portion between the source/drain regions 8.

In the structural body to be treated with the etching solution according to the present invention, as the material for the substrate 7, there are preferably used silicon, amorphous silicon, polysilicon and glass. As the material for wirings formed in the structural body, there may be used those wiring materials such as copper, tungsten, titanium-tungsten, aluminum, aluminum alloys, chromium and chromium alloys.

Examples of the preferred material for the interlayer insulating film 4 include silicon oxide films obtained by a high-density plasma chemical vapor deposition method (HDP), tetraethoxysilane (TEOS) and boron phosphor silicate glass (BPSG). Examples of the preferred material for the side wall 3 include silicon nitride (SiN). Examples of the preferred high dielectric material include $HfO_2$, $Al_2O_2$ and materials obtained by incorporating a silicon atom and/or a nitrogen atom and/or a metal such as La, Ti and Zr into $HfO_2$ or $Al_2O_3$. However, the materials used for the interlayer insulating film 4, the side wall 3 and the high dielectric material film 2 are not particularly limited to those materials described above.

As recognized from FIG. 1, when etching the dummy gate 1 made of silicon, the silicon etching solution according to the present invention is first brought into contact with the metal gate 2, the interlayer insulating film 5 and the side wall 4 in the structural body. Further, as etching of the dummy gate 1 proceeds, the underlying high dielectric material film 3 being present underneath the dummy gate 1 is exposed to outside and therefore the etching solution comes into contact with the high dielectric material film 3. Under the above condition, by using the silicon etching solution according to the present invention which is capable of selectively etching the dummy gate 1 made of silicon without etching the metal gate 2, the interlayer insulating film 5 and the side wall 4 as well as the high dielectric material film 3, it is possible to produce a transistor having a high precision and a high quality with a high yield while preventing damage to the respective portions of the transistor.

<<Etching of Dummy Gate>>

The temperature of the silicon etching solution according to the present invention when used, i.e., the temperature used upon etching the dummy gate, is usually from about 20 to about 80° C., preferably from 20 to 70° C. and more preferably from 20 to 60° C. The temperature of the etching solution upon use may be appropriately determined according to etching conditions or material of the substrate used.

The treating time upon the etching treatment with the silicon etching solution according to the present invention, i.e., the time required for etching the dummy gate, is usually in the range of from about 0.1 to about 10 min, preferably from 0.2 to 8 min and more preferably from 0.3 to 5 min, and may be appropriately determined according to etching conditions or material of the substrate used.

[Process for Producing Transistor]

The process for producing a transistor according to the present invention is characterized by using a structural body which includes a substrate, and a dummy gate laminate formed by laminating at least a high dielectric material film and a dummy gate made of silicon, a side wall disposed to cover a side surface of the laminate and an interlayer insulating film disposed to cover the side wall which are provided on the substrate, and including the step (I) of etching the dummy gate with an etching solution including 0.1 to 40% by weight of at least one alkali compound selected from the group consisting of ammonia, a diamine and a polyamine represented by the general formula (1), 0.01 to 40% by weight of at least one polyhydric alcohol selected from the group consisting of a polyhydric alcohol represented by the general formula (2), a polyhydric alcohol represented by the general formula (3), a cyclic polyhydric alcohol represented by the general formula (4) and a non-reducing sugar, and 40 to 99.89% by weight of water, in which the dummy gate is replaced with a metal gate containing hafnium, zirconium, titanium, tantalum or tungsten:

$$H_2N\text{—}(CH_2CH_2NH)_k\text{—}H \quad (1)$$

wherein k is an integer of 2 to 5;

$$H\text{—}(CH(OH))_l\text{—}R \quad (2)$$

wherein l is an integer of 2 to 6; and R is hydrogen or an alkyl group;

$$C\text{—}((CH_2)_mOH)_4 \quad (3)$$

wherein m is an integer of 1 or 2; and $$(CH(OH))_n \quad (4)$$

wherein n is an integer of 3 to 8.

In the process for producing a transistor according to the present invention, the structural body and the etching solution used in the step (I) are the same as described above. In addition, the temperature of the etching solution according to the present invention upon use as well as the treating time with the etching solution are also the same as described above.

In the etching step (I) using the etching solution according to the present invention, an ultrasonic wave may be used in combination, if required. In addition, a rinsing solution used after removing etching residues on the substrate according to the production process of the present invention is not necessarily an organic solvent such as alcohols, and water may be satisfactorily used as the rinsing solution.

<<Other Steps>>

The process for producing a transistor according to the present invention is not particularly limited to the above specific process as long as the process includes the etching step (I) using the etching solution according to the present invention. The process for producing a transistor according to one preferred embodiment of the present invention includes a step (A) of forming a high dielectric material film on a substrate; a step (B) of forming a dummy gate made of polysilicon on the high dielectric material film to form a laminate containing the high dielectric material film and the dummy gate; a step (C) of forming a side wall to cover a side surface of the laminate; a step (D) of forming an interlayer insulating film to cover the side wall; a step (E) of etching a natural silicon oxide film; the above step (I) of etching the dummy gate using the etching solution according to the present invention; and a step (F) of forming a metal gate on the high dielectric material film to form a laminate containing the high dielectric material film and the metal gate. The above steps (A) to (F) are not particularly limited and may be carried out by ordinary methods which may be generally adopted as respective steps in a process for production of transistors.

<Etching of Natural Silicon Oxide Film (Step (E))>

As shown in FIG. 1, since the dummy gate 1 made of silicon is brought into contact with air in the process for producing a transistor, the surface of the dummy gate tends to be subjected to natural oxidation, so that a natural silicon oxide film may be formed thereon. In consequence, in the production process of the present invention, before conducting the step of etching the dummy gate 1 using the etching solution according to the present invention (step (I)), the natural silicon oxide film 6 is preferably previously etched. As a result of such a previous etching step, it is possible to efficiently conduct the step of etching the dummy gate using the etching solution according to the present invention and therefore produce a transistor having a high precision and a high quality with a high yield.

In the step (E), in order to etch the natural silicon oxide film, there may be used ordinary etching solutions, for example, those etching solutions containing a fluorine compound such as hydrofluoric acid. In addition, in the step (E), the etching solution is allowed to come into contact with the metal gate 2, the interlayer insulating film 5 and the side wall 4 in the structural body. Therefore, it is preferred to use an etching solution which is free from damage to these portions, i.e., an etching solution having a capability of selectively etching the natural silicon oxide film. As the etching solution capable of satisfying the above requirements, there is preferably used an etching solution including 0.01 to 8% by weight of a fluorine compound, 20 to 90% by weight of a water-soluble organic solvent and water.

Specific examples of the preferred fluorine compound include hydrofluoric acid, ammonium fluoride and acid ammonium fluoride. Among these fluorine compounds, more preferred are ammonium fluoride and acid ammonium fluoride. In the present invention, these fluorine compounds may be used alone or in combination of any two or more thereof.

Examples of the preferred water-soluble organic solvent include alcohols such as ethanol, 2-propanol, ethylene glycol and diethylene glycol; glycol ethers such as diethylene glycol monomethyl ether, diethylene glycol monobutyl ether, dipropylene glycol monomethyl ether and dipropylene glycol monopropyl ether; amides such as N,N-dimethylformamide, N,N-dimethylacetamide and N-methyl-2-pyrrolidone; and dimethyl sulfoxide. These water-soluble organic solvents may be used alone or in combination of any two or more thereof.

In addition, the etching solution used in the step (E) may also contain an inorganic acid such as hydrochloric acid, nitric acid, sulfuric acid and phosphoric acid; and an organic acid such as acetic acid, propionic acid, oxalic acid and methanesulfonic acid in an amount of about 5% by weight or less. These acids may be used alone or in combination of any two or more thereof.

<<Transistor>>

The transistor obtained by the production process of the present invention includes a substrate 9, and a laminate formed by laminating at least a high dielectric material film 3 and a metal gate 2, a side wall 4 disposed to cover a side surface of the laminate and an interlayer insulating film 5 disposed to cover the side wall 4 which are provided on the substrate. More specifically, the transistor thus produced has a structure in which the dummy gate 1 in the structural body as shown in FIG. 1 to be subjected to the etching step using the etching solution according to the present invention is replaced with the metal gate 2 containing hafnium, zirconium, titanium, tantalum or tungsten. In addition, as shown in FIG. 1, the transistor obtained by the production process of the present invention further includes a source/drain region 8 and an isolation 7, and the high dielectric material film 3 is provided on a surface of the substrate 9 to cover a portion between the source/drain regions 8.

In the transistor obtained by the production process of the present invention, the material used for the substrate 9, the material used for the interlayer insulating film 5 and the material used for the side wall 4 are the same as the material used for the substrate 9, the material used for the interlayer insulating film 5 and the material used for the side wall 4 as described above with respect to the structural body, respectively.

The transistor obtained by the production process of the present invention may also include portions generally contained in transistors, for example, a barrier layer and an insulating film. Examples of a preferred barrier material forming the barrier layer include titanium, titanium nitride, tantalum and tantalum nitride. Examples of a preferred insulating material forming the insulating film include silicon oxide, silicon nitride, silicon carbide and derivatives of these materials.

In the laminate formed by laminating the high dielectric material film 3 and the metal gate 2 containing hafnium, zirconium, titanium, tantalum or tungsten, there may also be provided an additional metal gate 2 made of a metal material other than the metal forming the above metal gate 2 as well as a functional layer such as, for example, a characteristic-controlling film. Examples of the preferred semiconductor material used in the present invention include compound semiconductors such as gallium-arsenic, gallium-phosphorus and indium-phosphorus, and oxide semiconductors such as chromium oxide.

The transistor obtained by the production process of the present invention has a high precision and a high quality.

EXAMPLES

The present invention will be described in more detail below by referring to the following examples. It should be noted, however, that the following examples are only illustrative and not intended to limit the invention thereto.
Evaluation Method
Measuring Equipments:

SEM observation: Observed using an ultrahigh resolution field emission type scanning electron microscope "S-5500" available from Hitachi Hi-Technologies Corp.

FIB Fabrication: Fabricated using a focused ion beam fabrication device "FB-2100" available from Hitachi Hi-Technologies Corp.

STEM Observation: Observed using a scanning transmission electron microscope "HD-2300" available from Hitachi Hi-Technologies Corp.
Determination:
(Etching Condition of Dummy Gate 1 Made of Silicon)
 ○: Dummy Gate 1 was completely etched.
 x: Dummy Gate 1 was insufficiently etched.

Examples 1 to 66

Using a silicon wafer as a substrate, there were prepared structural bodies each having a section as shown in FIG. 1 in which respective transistor structures represented by 1A to 1I as shown in Table 1 were formed on the silicon wafer. In the respective Examples in which the respective structural bodies as shown in Table 3 were used, in order to remove a natural silicon oxide film being present on a surface of the dummy gate 1 made of silicon, the structural bodies thus prepared were immersed in a 0.05 wt % hydrofluoric acid etching solution at 25° C. for 2 min, rinsed with ultrapure water and then dried by spraying a dry nitrogen gas thereonto. Thereafter, the structural bodies were immersed in the respective etching solutions as shown in Table 3 (as to compositions of the respective etching solutions, refer to Table 2) at a predetermined temperature for a predetermined time, and then rinsed with ultrapure water and dried by spraying a dry nitrogen gas thereonto.

After being etched, a section of the respective transistors was subjected to SEM observation to determine the conditions of the dummy gate 1 made of silicon, the metal gate 2, the side wall 4 and the interlayer insulating film 5.

The high dielectric material film 3 was covered with the dummy gate 1 made of silicon. Therefore, when the dummy gate 1 made of silicon was removed using the etching solution, the high dielectric material film 3 was brought into contact with the etching solution. Thus, when observing the condition of the high dielectric material film 3, it was possible to determine whether or not any damage to the high dielectric material film by the etching solution was caused. In consequence, only in the case where the dummy gate 1 made of silicon was removed by the etching, the transistor obtained after the etching was subjected to thin film fabrication using FIB to form a thin film having a thickness of 200 nm or less, and the resulting thin film was observed by STEM to determine the condition of the high dielectric material film 3.

After being immersed in the etching solutions as shown in Table 2, it was confirmed that the metal gate 2, the side wall 4, the interlayer insulating film 5 and the high dielectric material film 3 were not etched. Therefore, in Tables 3 and 5, there are shown the evaluation results of the condition of the dummy gate 1 made of silicon.

In Examples 1 to 66 to which the production process of the present invention using the respective etching solutions as shown in Table 2 was applied, it was confirmed that the dummy gate 1 made of silicon was completely removed by etching as shown in Table 3.

Comparative Example 1

Using the structural body having the transistor structure 1D, the same procedure as in Example 1 was carried out except that after conducting the hydrofluoric acid treatment, the structural body was subjected to etching treatment using the 2 wt % tetramethyl ammonium hydroxide aqueous solution (etching solution 4A as shown in Table 4) as described in Non-Patent Document 2 in place of the etching solution 2A. As a result, as shown in Table 5, the etching solution was deficient in a capability of etching the dummy gate 1 made of silicon. From the above results, it was confirmed that the etching solution as described in Non-Patent Document 2 was inapplicable to removal of silicon by etching in the process for producing the transistor containing the high dielectric material and the aluminum-containing metal gate as aimed by the present invention.

Comparative Example 2

Using the structural body having the transistor structure 1B, the same procedure as in Example 1 was carried out except that after conducting the hydrofluoric acid treatment, the structural body was subjected to etching treatment using the etching solution containing 58% by weight of ethylenediamine, 21% by weight of catechol, 0.4% by weight of pyrazine and 20.6% by weight of water (etching solution 4B as shown in Table 4) as described in Non-Patent Document 2 in place of the etching solution 2A. As a result, as shown in Table 5, the etching solution was deficient in a capability of etching the dummy gate 1 made of silicon. From the above results, it was confirmed that the etching solution as described in Non-Patent Document 2 was inapplicable to removal of silicon by etching in the process for producing the transistor containing the high dielectric material and the metal gate as aimed by the present invention.

Comparative Example 3

Using the structural body having the transistor structure 1C, the same procedure as in Example 1 was carried out except that after conducting the hydrofluoric acid treatment, the structural body was subjected to etching treatment using the aqueous solution containing 10% by weight of tetramethyl ammonium hydroxide, 10% by weight of hydroxyl amine and 5% by weight of sorbitol (etching solution 4C as shown in Table 4) as described in Patent Document 3 in place of the etching solution 2A. As a result, as shown in Table 5, the etching solution was deficient in a capability of etching the dummy gate 1 made of silicon. From the above results, it was confirmed that the aqueous solution as described in Patent Document 3 had an excessively low silicon etch rate. Further, the reducing compound contained in the aqueous solution had a fear of deteriorating an etching capability of the etching solution composition owing to its reaction with oxygen in air.

Therefore, it was required that a special care should be taken upon storage of the etching solution. Thus, it was confirmed that the etching solution as described in Patent Document 2 was inapplicable to removal of silicon by etching in the process for producing the transistor containing the high dielectric material and the metal as aimed by the present invention.

Comparative Example 4

Using the structural body having the transistor structure 1G, the same procedure as in Example 1 was carried out except that after conducting the hydrofluoric acid treatment, the structural body was subjected to etching treatment using the aqueous solution containing 5% by weight of hexamethylenediamine(1,6-hexanediamine) and 1% by weight of sorbitol (etching solution 4D as shown in Table 4) as described in Patent Document 4 in place of the etching solution 2A. As a result, as shown in Table 5, the aqueous solution was deficient in a capability of etching the dummy gate 1 made of silicon. From the above results, it was confirmed that the aqueous solution as described in Patent Document 4 was inapplicable to removal of silicon by etching in the process for producing the transistor containing the high dielectric material and the metal gate as aimed by the present invention.

Comparative Example 5

Using the structural body having the transistor structure 1E, the same procedure as in Example 1 was carried out except that after conducting the hydrofluoric acid treatment, the structural body was subjected to etching treatment using the alkali aqueous solution containing 9% by weight of ammonia and 91% by weight of water (etching solution 4E as shown in Table 4) in place of the etching solution 2A. As a result, as shown in Table 5, the alkali aqueous solution was deficient in a capability of etching the dummy gate 1 made of silicon. From the above results, it was confirmed that the alkali aqueous solution as described in Patent Document 5 was inapplicable to removal of silicon by etching in the process for producing the transistor containing the high dielectric material and the metal gate as aimed by the present invention.

Comparative Example 6

Using the structural body having the transistor structure 1I, the same procedure as in Example 1 was carried out except that after conducting the hydrofluoric acid treatment, the structural body was subjected to etching treatment using a polyhydric alcohol-containing aqueous solution containing 5% by weight of sorbitol and 95% by weight of water (etching solution 4F as shown in Table 4) in place of the etching solution 2A. As a result, as shown in Table 5, the polyhydric alcohol-containing aqueous solution was deficient in a capability of etching the dummy gate 1 made of silicon. From the above results, it was confirmed that the aqueous solution containing the polyhydric alcohol merely was inapplicable to removal of silicon by etching in the process for producing the transistor containing the high dielectric material and the metal gate as aimed by the present invention.

Comparative Example 7

Using the structural body having the transistor structure 1F, the same procedure as in Example 1 was carried out except that after conducting the hydrofluoric acid treatment, the structural body was subjected to etching treatment using an aqueous solution containing 5% by weight of 1,3-propanediamine, 1% by weight of catechol and 94% by weight of water (etching solution 4G as shown in Table 4) in place of the etching solution 2A. As a result, as shown in Table 5, the aqueous solution was deficient in a capability of etching the dummy gate 1 made of silicon. From the above results, it was confirmed that the aqueous solution containing the alkali compound and the polyhydric alcohol in the form of an aromatic polyhydric alcohol was inapplicable to removal of silicon by etching in the process for producing the transistor containing the high dielectric material and the metal gate as aimed by the present invention.

Comparative Example 8

Using the structural body having the transistor structure 1H, the same procedure as in Example 1 was carried out except that after conducting the hydrofluoric acid treatment, the structural body was subjected to etching treatment using an aqueous solution containing 0.5% by weight of 1,3-propanediamine and 99.5% by weight of water (etching solution 4H as shown in Table 4) in place of the etching solution 2A. As a result, as shown in Table 5, the aqueous solution was deficient in a capability of etching the dummy gate 1 made of silicon. From the above results, it was confirmed that the aqueous solution prepared by removing the polyhydric alcohol from the etching solution 2D as shown in Table 2 was inapplicable to removal of silicon by etching in the process for producing the transistor containing the high dielectric material and the metal gate as aimed by the present invention.

Comparative Example 9

Using the structural body having the transistor structure 1A, the same procedure as in Example 1 was carried out except that after conducting the hydrofluoric acid treatment, the structural body was subjected to etching treatment using an aqueous solution containing 30% by weight of 1,3-propanediamine and 70% by weight of water (etching solution 4I as shown in Table 4) in place of the etching solution 2A. As a result, as shown in Table 5, the aqueous solution was deficient in a capability of etching the dummy gate 1 made of silicon. From the above results, it was confirmed that the aqueous solution prepared by removing the polyhydric alcohol from the etching solution 2E as shown in Table 2 was inapplicable to removal of silicon by etching in the process for producing the transistor containing the high dielectric material and the metal gate as aimed by the present invention.

TABLE 1

| | Materials | | | |
|---|---|---|---|---|
| Transistor structure | Metal material 2 | High dielectric material 3 | Side wall 4 | Interlayer insulating film 5 |
| 1A | Tungsten | $HfO_2$ | SiN | HDP |
| 1B | Tantalum | HfSiO | SiN | HDP |
| 1C | Titanium | HfSiON | SiN | HDP |
| 1D | Zirconium | HfLaO | SiN | TEOS |
| 1E | Tungsten | HfLaON | SiN | TEOS |
| 1F | Tantalum | HfTiSiON | SiN | TEOS |
| 1G | Titanium | HfAlSiON | SiN | TEOS |
| 1H | Titanium | HfZrO | SiN | TEOS |
| 1I | Hafnium | $Al_2O_3$ | SiN | BPSG |

Note:
HDP: Silicon oxide film produced by high-density plasma chemical vapor deposition method
TEOS: Tetraethoxysilane
BPSG: Boron phosphor silicate glass

TABLE 2

| Etching solution | Alkali Kind | Conc. (wt %) | Polyhydric alcohol Kind | Conc. (wt %) | Water Conc. (wt %) |
|---|---|---|---|---|---|
| 2A | Ammonia | 9 | Ethylene glycol | 1 | 90 |
| 2B | Ethylenediamine | 5 | Glycerin | 1 | 94 |
| 2C | 1,2-Propanediamine | 5 | Sorbitol | 10 | 85 |
| 2D | 1,3-Propanediamine | 0.5 | Sorbitol | 0.01 | 99.49 |
| 2E | 1,3-Propanediamine | 30 | Sorbitol | 5 | 65 |
| 2F | Diethylenetriamine | 5 | Glycerin | 1 | 94 |
| 2G | Triethylenetetramine | 5 | Sorbitol | 5 | 90 |
| 2H | 1,3-Propanediamine | 5 | Propylene glycol | 0.1 | 94.9 |
| 2I | 1,3-Propanediamine | 5 | Meso-erythritol | 5 | 90 |
| 2J | 1,3-Propanediamine | 5 | Penta-erythritol | 0.1 | 94.9 |
| 2K | 1,3-Propanediamine | 5 | Xylitol | 40 | 55 |
| 2L | 1,3-Propanediamine | 5 | Sorbitol | 5 | 90 |
| 2M | 1,3-Propanediamine | 5 | Inositol | 5 | 90 |
| 2N | 1,3-Propanediamine | 5 | Sucrose | 5 | 90 |
| 2O | 1,3-Propanediamine | 5 | Trehalose | 1 | 94 |
| 2P | 1,3-Propanediamine | 5 | Raffinose | 1 | 94 |

TABLE 3

| Examples | Transistor structure | Etching solution | Treating temperature/°C | Treating time/min | Evaluation Etching condition of polysilicon 1 |
|---|---|---|---|---|---|
| 1 | 1A | 2A | 25 | 2 | ○ |
| 2 | 1B | 2A | 25 | 2 | ○ |
| 3 | 1C | 2A | 25 | 2 | ○ |
| 4 | 1D | 2A | 25 | 2 | ○ |
| 5 | 1E | 2A | 25 | 2 | ○ |
| 6 | 1F | 2A | 25 | 2 | ○ |
| 7 | 1G | 2A | 25 | 2 | ○ |
| 8 | 1H | 2A | 25 | 2 | ○ |
| 9 | 1I | 2A | 25 | 2 | ○ |
| 10 | 1A | 2F | 25 | 2 | ○ |
| 11 | 1B | 2F | 25 | 2 | ○ |
| 12 | 1C | 2F | 25 | 2 | ○ |
| 13 | 1D | 2F | 25 | 2 | ○ |
| 14 | 1E | 2F | 25 | 2 | ○ |
| 15 | 1F | 2F | 25 | 2 | ○ |
| 16 | 1G | 2F | 25 | 2 | ○ |
| 17 | 1H | 2F | 25 | 2 | ○ |
| 18 | 1I | 2F | 25 | 2 | ○ |
| 19 | 1A | 2N | 25 | 2 | ○ |
| 20 | 1B | 2N | 25 | 2 | ○ |
| 21 | 1C | 2N | 25 | 2 | ○ |
| 22 | 1D | 2N | 25 | 2 | ○ |
| 23 | 1E | 2N | 25 | 2 | ○ |
| 24 | 1F | 2N | 25 | 2 | ○ |
| 25 | 1G | 2N | 25 | 2 | ○ |
| 26 | 1H | 2N | 25 | 2 | ○ |
| 27 | 1I | 2N | 25 | 2 | ○ |
| 28 | 1A | 2B | 25 | 2 | ○ |
| 29 | 1A | 2C | 25 | 2 | ○ |
| 30 | 1A | 2D | 25 | 4 | ○ |
| 31 | 1A | 2E | 25 | 3 | ○ |
| 32 | 1A | 2G | 25 | 2 | ○ |
| 33 | 1A | 2H | 25 | 2 | ○ |
| 34 | 1A | 2I | 25 | 2 | ○ |
| 35 | 1A | 2J | 25 | 2 | ○ |
| 36 | 1A | 2K | 25 | 2 | ○ |
| 37 | 1A | 2L | 25 | 2 | ○ |
| 38 | 1A | 2M | 25 | 2 | ○ |
| 39 | 1A | 2O | 25 | 2 | ○ |
| 40 | 1A | 2P | 25 | 2 | ○ |
| 41 | 1B | 2B | 25 | 2 | ○ |
| 42 | 1B | 2C | 25 | 2 | ○ |
| 43 | 1B | 2D | 25 | 4 | ○ |
| 44 | 1B | 2E | 25 | 3 | ○ |
| 45 | 1B | 2G | 25 | 2 | ○ |
| 46 | 1B | 2H | 25 | 2 | ○ |
| 47 | 1B | 2I | 25 | 2 | ○ |
| 48 | 1B | 2J | 25 | 2 | ○ |
| 49 | 1B | 2K | 25 | 2 | ○ |
| 50 | 1B | 2L | 25 | 2 | ○ |
| 51 | 1B | 2M | 25 | 2 | ○ |
| 52 | 1B | 2O | 25 | 2 | ○ |
| 53 | 1B | 2P | 25 | 2 | ○ |
| 54 | 1C | 2B | 25 | 2 | ○ |
| 55 | 1C | 2C | 25 | 2 | ○ |
| 56 | 1C | 2D | 25 | 4 | ○ |
| 57 | 1C | 2E | 25 | 3 | ○ |
| 58 | 1C | 2G | 25 | 2 | ○ |
| 59 | 1C | 2H | 25 | 2 | ○ |
| 60 | 1C | 2I | 25 | 2 | ○ |
| 61 | 1C | 2J | 25 | 2 | ○ |
| 62 | 1C | 2K | 25 | 2 | ○ |
| 63 | 1C | 2L | 25 | 2 | ○ |
| 64 | 1C | 2M | 25 | 2 | ○ |
| 65 | 1C | 2O | 25 | 2 | ○ |
| 66 | 1C | 2P | 25 | 2 | ○ |

TABLE 4

| Etching solution | Composition of etching solution (conc.: wt %) |
|---|---|
| 4A | Tetramethyl ammonium hydroxide: 2%; water: 98% |
| 4B | Ethylenediamine: 58%; catechol: 21%; pyrazine: 0.4%; water: 20.6% |
| 4C | Tetramethyl ammonium hydroxide: 10%; hydroxyl amine: 10%; water: 80% |
| 4D | Tetramethyl ammonium hydroxide: 10%; hydroxyl amine: 10%; water: 80% |
| 4E | Ammonia: 9%; water: 91% |
| 4F | Sorbitol: 5%; water: 95% |
| 4G | 1,3-Propanediamine: 5%; catechol: 1%; water: 94% |
| 4H | 1,3-Propanediamine: 0.5%; water: 99.5% |
| 4I | 1,3-Propanediamine: 30%; water: 70% |

TABLE 5

| Comparative Examples | Transistor structure | Etching solution | Treating temperature/°C | Treating time/min | Evaluation Etching condition of polysilicon 1 |
|---|---|---|---|---|---|
| 1 | 1D | 4A | 25 | 5 | X |
| 2 | 1B | 4B | 25 | 2 | X |
| 3 | 1C | 4C | 25 | 2 | X |
| 4 | 1G | 4D | 25 | 5 | X |
| 5 | 1E | 4E | 25 | 2 | X |
| 6 | 1I | 4F | 25 | 5 | X |
| 7 | 1F | 4G | 25 | 5 | X |
| 8 | 1H | 4H | 25 | 4 | X |
| 9 | 1A | 4I | 25 | 3 | X |

INDUSTRIAL APPLICABILITY

The etching solution according to the preset invention is capable of selectively etching a dummy gate made of silicon without etching a metal gate containing hafnium, zirconium, titanium, tantalum or tungsten, an interlayer insulating film, a side wall and a high dielectric material film. For this reason, the etching solution can be suitably used in a process for producing a transistor containing the high dielectric material film and the metal gate and therefore is useful from the industrial viewpoints.

The invention claimed is:

1. A silicon etching solution for etching a dummy gate made of silicon in a process for producing a transistor using a structural body comprising a substrate, and a dummy gate laminate formed by laminating at least a high dielectric material film and the dummy gate made of silicon, a side wall disposed to cover a side surface of the laminate and an interlayer insulating film disposed to cover the side wall which are provided on the substrate, in which the dummy gate is replaced with a metal gate containing hafnium, zirconium, titanium, tantalum or tungsten, said silicon etching solution consisting essentially of 0.1 to 40% by weight of at least one alkali compound selected from the group consisting of ammonia, a diamine and a polyamine represented by the general formula (1), 0.01 to 40% by weight of at least one polyhydric alcohol selected from the group consisting of a polyhydric alcohol represented by the general formula (2), a polyhydric alcohol represented by the general formula (3), a cyclic polyhydric alcohol represented by the general formula (4) and a non-reducing sugar, and 40 to 99.89% by weight of water:

$$H_2N-(CH_2CH_2NH)_k-H \qquad (1)$$

wherein k is an integer of 2 to 5;

$$H-(CH(OH))_l-R \qquad (2)$$

wherein l is an integer of 2 to 6; and R is hydrogen or an alkyl group;

$$C-((CH_2)_mOH)_4 \qquad (3)$$

wherein m is an integer of 1 or 2; and $$(CH(OH))_n \qquad (4)$$

wherein n is an integer of 3 to 8.

2. The silicon etching solution according to claim 1, wherein the diamine and the polyamine represented by the general formula (1) are at least one compound selected from the group consisting of ethylenediamine, 1,2-propanediamine and 1,3-propanediamine, and at least one compound selected from the group consisting of diethylenetriamine and triethylenetetramine, respectively.

3. The silicon etching solution according to claim 1, wherein the polyhydric alcohol represented by any of the general formulae (2) to (4) is at least one compound selected from the group consisting of ethylene glycol, glycerin, meso-erythritol, xylitol, sorbitol, propylene glycol, pentaerythritol and inositol.

4. The silicon etching solution according to claim 1, wherein the non-reducing sugar is sucrose, trehalose or raffinose.

5. The silicon etching solution according to claim 1, wherein a high dielectric material forming the high dielectric material film is $HfO_2$, HfSiO, HfSiON, HfLaO, HfLaON, HfTiSiON, HfAlSiON, HfZrO or $Al_2O_3$.

6. A process for producing a transistor using a structural body comprising a substrate, and a dummy gate laminate formed by laminating at least a high dielectric material film and a dummy gate made of silicon, a side wall disposed to cover a side surface of the laminate and an interlayer insulating film disposed to cover the side wall which are provided on the substrate, said process comprising the following step (I) in which the dummy gate is replaced with a metal gate containing hafnium, zirconium, titanium, tantalum or tungsten:

Step (I): etching the silicon with a silicon etching solution consisting essentially of 0.1 to 40% by weight of at least one alkali compound selected from the group consisting of ammonia, a diamine and a polyamine represented by the general formula (1), 0.01 to 40% by weight of at least one polyhydric alcohol selected from the group consisting of a polyhydric alcohol represented by the general formula (2), a polyhydric alcohol represented by the general formula (3), a cyclic polyhydric alcohol represented by the general formula (4) and a non-reducing sugar, and 40 to 99.89% by weight of water:

$$H_2N-(CH_2CH_2NH)_k-H \qquad (1)$$

wherein k is an integer of 2 to 5;

$$H-(CH(OH))_l-R \qquad (2)$$

wherein l is an integer of 2 to 6; and R is hydrogen or an alkyl group;

$$C-((CH_2)_mOH)_4 \qquad (3)$$

wherein m is an integer of 1 or 2; and $$(CH(OH))_n \qquad (4)$$

wherein n is an integer of 3 to 8.

7. The process for producing a transistor according to claim 6, wherein the diamine and the polyamine represented by the general formula (1) are at least one compound selected from the group consisting of ethylenediamine, 1,2-propanediamine and 1,3-propanediamine, and at least one compound selected from the group consisting of diethylenetriamine and triethylenetetramine, respectively.

8. The process for producing a transistor according to claim 6, wherein the polyhydric alcohol represented by any of the general formulae (2) to (4) is at least one compound selected from the group consisting of ethylene glycol, glycerin, meso-erythritol, xylitol, sorbitol, propylene glycol, pentaerythritol and inositol.

9. The process for producing a transistor according to claim 6, wherein the non-reducing sugar is sucrose, trehalose or raffinose.

10. The process for producing a transistor according to claim 6, wherein a high dielectric material forming the high dielectric material film is $HfO_2$, HfSiO, HfSiON, HfLaO, HfLaON, HfTiSiON, HfAlSiON, HfZrO or $Al_2O_3$.

* * * * *